(12) United States Patent
Chun

(10) Patent No.: US 8,785,254 B2
(45) Date of Patent: Jul. 22, 2014

(54) METHOD OF MANUFACTURING HIGH-CAPACITY SEMICONDUCTOR PACKAGE

(71) Applicant: STS Semiconductor & Telecommunications Co., Ltd., Chungcheongnam-do (KR)

(72) Inventor: Jung Hwan Chun, Chungcheongnam-do (KR)

(73) Assignee: STS Semiconductor & Telecommunications Co., Ltd., Chungcheongnam-do (KR)

( * ) Notice: Subject to any disclaimer, the term of this patent is extended or adjusted under 35 U.S.C. 154(b) by 0 days.

(21) Appl. No.: 13/846,492

(22) Filed: Mar. 18, 2013

(65) Prior Publication Data
US 2013/0323885 A1 Dec. 5, 2013

(30) Foreign Application Priority Data
May 30, 2012 (KR) ........................ 10-2012-0057467

(51) Int. Cl.
*H01L 21/00* (2006.01)

(52) U.S. Cl.
USPC ......................................................... 438/123

(58) Field of Classification Search
USPC ......................................................... 438/123
See application file for complete search history.

*Primary Examiner* — Marvin Payen
(74) *Attorney, Agent, or Firm* — Kilpatrick Townsend & Stockton LLP

(57) ABSTRACT

A method of manufacturing a high-capacity semiconductor package includes preparing a leadframe not comprising a chip mount area and comprising only a lead on a tape; attaching an interposer on a center area of the leadframe; stacking semiconductor chips stepwise on a first surface of the interposer; performing a first wire bonding process so as to connect the semiconductor chips, the lead, and the interposer; performing a first molding process so as to encapsulate a top surface of the leadframe, the semiconductor chips, and wires; detaching a tape from the leadframe and turning the leadframe on which the first molding process has been performed upside down; stacking semiconductor chips on a second surface of the interposer; performing a second wire bonding process so as to connect the semiconductor chips, the lead, and the interposer; and performing a second molding process so as to encapsulate a bottom surface of the leadframe, the semiconductor chips, and wires.

10 Claims, 4 Drawing Sheets

METHOD OF MANUFACTURING HIGH-CAPACITY SEMICONDUCTOR PACKAGE

CROSS-REFERENCE TO RELATED PATENT APPLICATION

This application claims the benefit of Korean Patent Application No. 10-2012-0057467, filed on May 30, 2012, in the Korean Intellectual Property Office, the disclosure of which is incorporated herein in its entirety by reference.

BACKGROUND OF THE INVENTION

1. Field of the Invention

Aspects of the present invention relate to a method of manufacturing a stack-type multi-chip semiconductor package, and more particularly, to a method of manufacturing a stack-type high-capacity semiconductor package in which a plurality of semiconductor chips are stacked on upper and lower surfaces of a leadframe.

2. Description of the Related Art

A demand for semiconductor packages, including NAND flash products with high capacity, has steadily increased, with a demand for high-capacity memory devices in IT equipment. To satisfy such a demand, as an example of a method of manufacturing a semiconductor package, a method of manufacturing a high-capacity semiconductor package by stacking a plurality of semiconductor chips in an assembly process, rather than by increasing a memory capacity in a wafer manufacturing process, has been adopted.

As methods of stacking a plurality of semiconductor chips, a method of stacking a plurality of semiconductor chips on one of the upper and lower surfaces of a base frame, such as a printed circuit board or a leadframe, and a method of stacking a plurality of semiconductor chips on a surface of a base frame in a zigzag pattern have been introduced. When the leadframe is used as a base frame, however, it is difficult to stack at least four semiconductor chips. Also, when the printed circuit board is used as a base frame to manufacture a stack-type semiconductor package, the stack-type semiconductor package has poor reliability.

SUMMARY OF THE INVENTION

Aspects of the present invention provide a method of manufacturing a stack-type high-capacity semiconductor package by using a leadframe, whereby a high reliability is obtained and semiconductor chips are stacked on both surfaces of the leadframe.

According to an aspect of the present invention, there is provided a method of manufacturing a stack-type high-capacity semiconductor package, wherein the method includes: preparing a leadframe not including a chip mount area and comprising only a lead on a tape; attaching an interposer on a center area of the leadframe; stacking a plurality of semiconductor chips stepwise on a first surface of the interposer; performing a first wire bonding process so as to connect the semiconductor chips, the lead, and the interposer; performing a first molding process so as to encapsulate a top surface of the leadframe, the semiconductor chips, and wires; detaching a tape from the leadframe and turning the leadframe on which the first molding process has been performed upside down; stacking a plurality of semiconductor chips on a second surface of the interposer; performing a second wire bonding process so as to connect the semiconductor chips, the lead, and the interposer; and performing a second molding process so as to encapsulate a bottom surface of the leadframe, the semiconductor chips, and wires.

The tape is attached on the bottom surface of the leadframe, and the tips of inner leads of the leadframe are in a state that enables wire bonding to be performed on both surfaces of the leadframe.

The interposer may include one selected from a silicon wafer and a printed circuit board.

The number of semiconductor chips stacked is 2 to 8, and the semiconductor chips have polished bottom surfaces to decrease a thickness of the semiconductor chips.

The first and second wire bonding processes may include at least one selected from wire bonding that connects the semiconductor chips with each other, wire bonding that connects the semiconductor chip and the lead, wire bonding that connects the semiconductor chip and the interposer, and wire bonding that connects the interposer and the lead.

The method further includes, after detaching the tape from the leadframe, performing a cleaning process on the bottom surface of the leadframe, and after performing the second molding process, a marking process may be additionally performed on a surface of a molded encapsulating material.

After performing the marking process, the method further includes a trimming process for separating a plurality of outer leads of the leadframe from one another, and a forming process for bending each of the plurality of outer leads.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
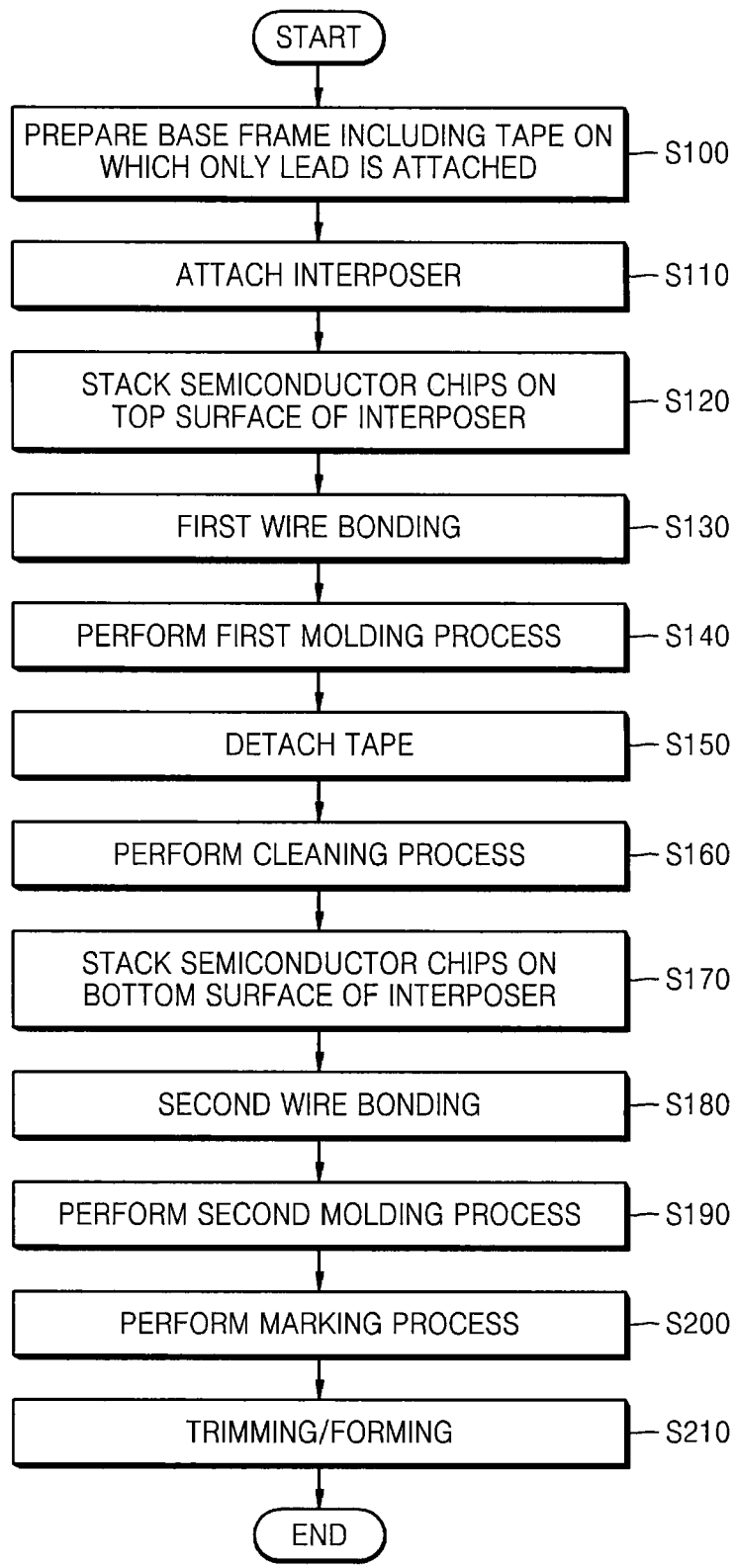
FIG. 1 is a flowchart for explaining a method of manufacturing a stack-type high-capacity semiconductor package, according to an embodiment of the present invention.

Reference will now be made in detail to example embodiments, examples of which are illustrated in the accompanying drawings. However, example embodiments are not limited to the embodiments illustrated hereinafter, and various changes in form and details may be made herein. Rather, these embodiments are provided so that this disclosure will be thorough and complete, and will fully convey the scope of the invention to those skilled in the art. In addition, the size of each element in the drawings is exaggerated for convenience of explanation.

It will be understood that when an element is referred to as being "on" another element or "connected" to another element, it can be directly on the other element or directly connected to the other element or intervening elements may also be present. In contrast, when an element is referred to as being "directly on" or "directly connected to" another element, there are no intervening elements present. The same may be applied to the terms used to explain a relationship between elements, for example, "between" and "directly between."

Although terms, such as 'first' and 'second', can be used to describe various elements, the elements cannot be limited by the terms. The terms can be used to classify a certain element from another element. For example, a first element can be named a second element without leaving from the right scope of the inventive concept, and likely the second element can be named the first element.

An expression in the singular includes an expression in the plural unless they are clearly different from each other in a context. In the application, it should be understood that terms, such as 'include' and 'have', are used to indicate the existence of implemented feature, number, step, operation, element, part, or a combination of them without excluding in advance the possibility of existence or addition of one or more other features, numbers, steps, operations, elements, parts, or combinations of them.

All terms used herein including technical or scientific terms have the same meaning as those generally understood by those of ordinary skill in the art unless they are defined differently. It should be understood that terms generally used, which are defined in a dictionary, have the same meaning as in a context of related technology, and the terms are not understood as ideal or excessively formal meaning unless they are clearly defined in the application.

Hereinafter, exemplary embodiments of the present invention will be described in detail with reference to the accompanying drawings. Throughout the drawings, like reference numerals refer to like elements.

FIG. 1 is a flowchart for explaining a method of manufacturing a stack-type high-capacity semiconductor package, according to an embodiment of the present invention.

Referring to FIG. 1, first, a base frame where only a lead is attached on a tape is prepared (operation S100). The base frame is a leadframe formed of copper and a tip of an inner lead of the leadframe may be surface-treated so as to perform wire bonding on both top and bottom surfaces of the leadframe. Subsequently, an interposer is attached on a center area of the tape of the leadframe (operation S110). Afterwards, two to eight semiconductor chips are stacked stepwise on a top surface, i.e., a first surface, of the interposer (operation S120). Then, a first wire bonding process is performed so as to connect the semiconductor chips, the interposer, and the lead to one another by gold wires (operation S130). Thereafter, a first molding process is performed so as to encapsulate the top surface of the leadframe, the semiconductor chips, and the wires by using an encapsulating material, such as an epoxy mold compound (EMC) (operation S140).

A detaching process for detaching the tape from the leadframe on which the first molding process has been performed is performed (operation S150), a cleaning process for cleaning the bottom surface of the leadframe is selectively performed (operation S160), and the leadframe is then turned upside down 180 degrees.

Subsequently, two to eight semiconductor chips are stacked stepwise on a bottom surface, i.e., a second surface, of the interposer so as to be symmetrical to the semiconductor chips on the first surface of the interposer (operation S170). Then, a second wire bonding process is performed so as to connect the semiconductor chips, the interposer, and the lead by gold wires (operation S180). A second molding process is performed so as to encapsulate bottom surface of the leadframe, the semiconductor chips, and the wires by using an encapsulating material, such as an EMC (operation S190). Thereafter, a marking process for marking a type of the produced product on a surface of the encapsulating material with which the second molding process has been performed is performed (operation S200). Afterwards, a trimming process for separating a plurality of outer leads from one another and a forming process for bending each outer lead are performed (operation S210), thereby completing the manufacture of a stack-type high-capacity semiconductor package according to an exemplary embodiment of the present invention.

FIGS. 2 through 7 are cross-sectional views sequentially illustrating a method of manufacturing a stack-type high-capacity semiconductor package, according to an embodiment of the present invention.

Figure 2:
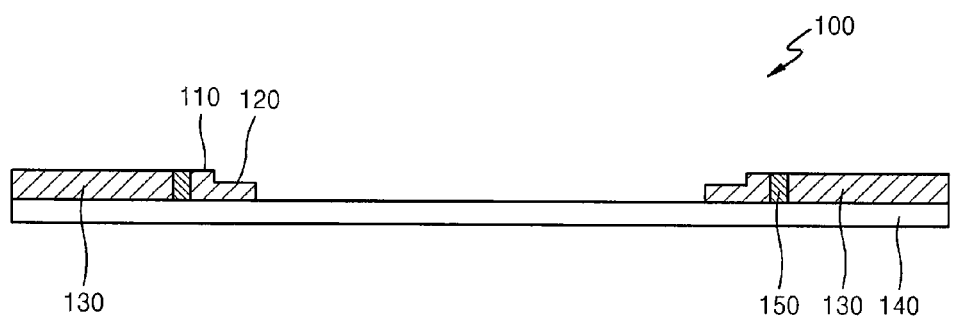
FIGS. 2 through 7 are cross-sectional views sequentially illustrating a method of manufacturing a stack-type high-capacity semiconductor package, according to an embodiment of the present invention.

Referring to FIG. 2, a leadframe 100 is prepared as a base frame for a semiconductor package. The leadframe 100 has a structure in which a chip mount area on which a semiconductor chip is to be mounted is not on a center area of the leadframe 100. A tape 140 is attached on a bottom surface of the leadframe 100, and only a lead including outer leads 130 and inner leads 110 is attached on the tape 140. In the leadframe 100, the inner leads 110 and the outer leads 130 are separated by a damber line 150. The damber line 150 connects leads 110 and 130 with one another and is removed in a subsequent trimming process so that the leads 110 and 130 are separated from one another.

In this embodiment, only the tape 140 is present on the center area of the leadframe 100 on which a semiconductor chip is to be mounted, and tips 120 of the inner leads 110 may be surface-treated so as to perform wire bonding on both top and bottom surfaces of the leadframe 100. In an embodiment, the tips 120 of the inner leads 110 may be surface-treated by silver plating so as to easily form an alloy with gold wires.

Figure 3:
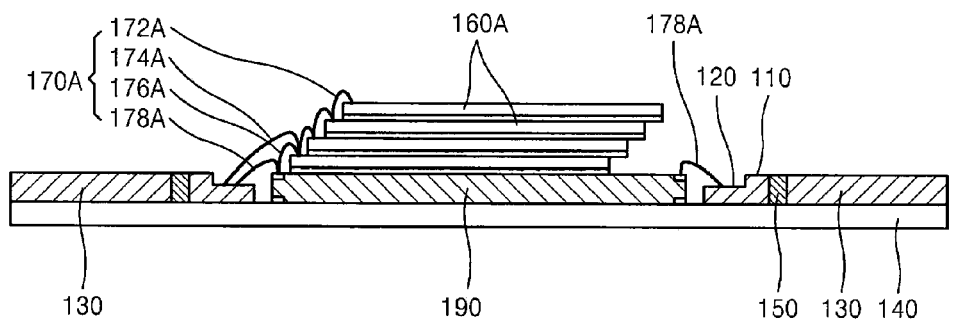

Referring to FIG. 3, an interposer 190 is mounted on the tape 140 at a center area of the leadframe 100. The interposer 190 is disposed so as to easily perform wire bonding in a vertical direction on semiconductor chips 160A to be mounted in subsequent processes. The interposer 140 may be one selected from a silicon wafer or a printed circuit board (PCB).

Subsequently, the semiconductor chips 160A are stacked stepwise using a die attach film (DAF). The number of mounted semiconductor chips 160A may be 2 to 8. In addition, the semiconductor chips 160A of which bottom surfaces are polished may be used to decrease the thickness of the semiconductor chips 160A.

Then, a first wire bonding process is performed so as to connect the semiconductor chips 160A, the tips 120 of the inner leads 110, and the interposer 190. Wires 170A used in the first wire bonding process may include wires 172A that connect the respective semiconductor chips 160A with each other, wires 174A that connect the semiconductor chip 160A and the tips 120 of the inner leads 110, wires 176A that connect the semiconductor chip 160A and the interposer 190, and wires 178A that connect the interposer 190 and the tips 120 of the inner leads 110. In this regard, the wires 178A that connect the interposer 190 and the tips 120 of the inner leads 110 may be used to enhance ground characteristics.

Figure 4:
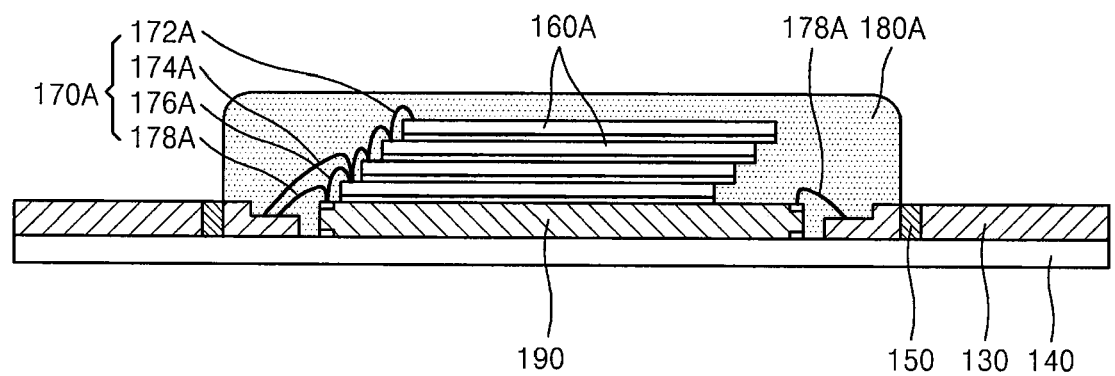
Figure 5:
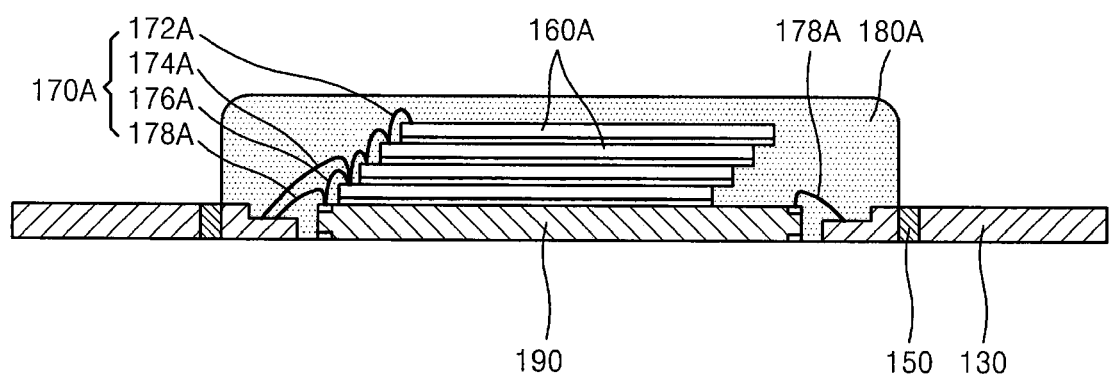

Referring to FIGS. 4 and 5, the leadframe 100 on which the first wire bonding process has been performed is subjected to a first molding process. In the first molding process, an encapsulating material 180A (e.g., EMC) is formed within the damber line 150 of the leadframe 100 to encapsulate a top surface of the interposer 190, top surfaces of the inner leads 110, the semiconductor chips 160A, and the wires 170A. In the first molding process, the tape 140 fixes the interposer 190 and prevents leakage from the encapsulating material 180A in the form of a resin. Then, the tape 140 attached on the bottom surface of the leadframe 100 is detached. In this regard, if desired, a cleaning process for removing impurities generated in bottom surfaces of the inner leads 110 and the outer leads 130 may be selectively performed. In the cleaning process, a cleaning solution may be optionally used in correspondence to an adhering material used in the tape 140, and any cleaning solution capable of appropriately removing impurities generated during manufacturing processes may be used.

Figure 6:
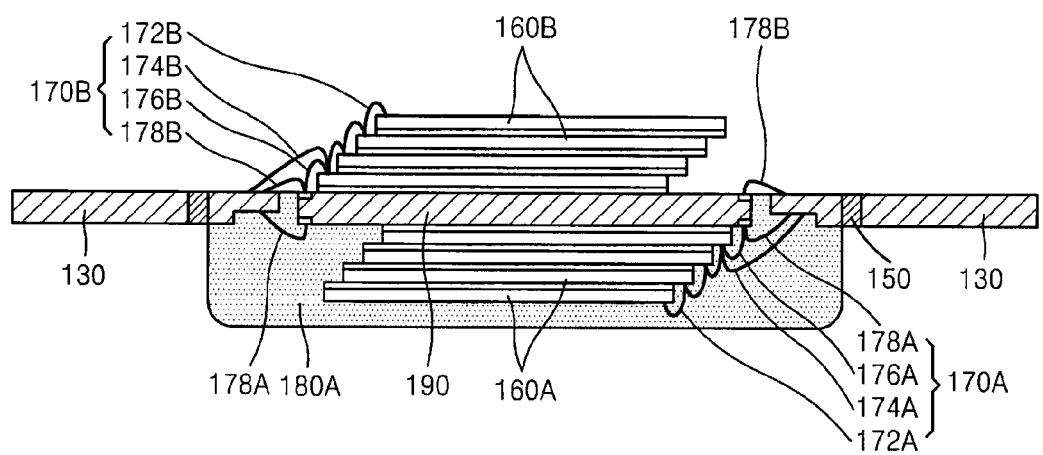

Referring to FIG. 6, after the first molding process and the cleaning process are completed, the leadframe 100 is turned upside down 180 degrees. Accordingly, the second surface of the interposer 190 is exposed, and thus, the interposer 190 may act as a chip mount area. Semiconductor chips 160B are stacked stepwise on the second surface of the interposer 190. In this regard, the semiconductor chips 160B may be stacked so as to be symmetric to the semiconductor chips 160A stacked on the top surface, i.e., the first surface of the interposer 190.

In this embodiment, the number of mounted semiconductor chips 160B may be from 2 to 8. In addition, the semiconductor chips 160B of which bottom surfaces are polished may be used to decrease the thickness of the semiconductor chips 160B.

Subsequently, a second wire bonding process is performed in the same manner as illustrated in FIG. 3 so as to connect the semiconductor chips 160B, the tips 120 of the inner leads 110, and the interposer 190. Wires 170B used in the second wire bonding process may include wires 172B that connect the respective semiconductor chips 160B with each other, wires 174B that connect the semiconductor chip 160B and the tips 120 of the inner leads 110, wires 176B that connect the semiconductor chip 160B and the interposer 190, and wires 178B that connect the interposer 190 and the tips 120 of the inner leads 110. In this regard, the wires 178B that connect the interposer 190 and the tips 120 of the inner leads 110 may be used to enhance ground characteristics.

Figure 7:
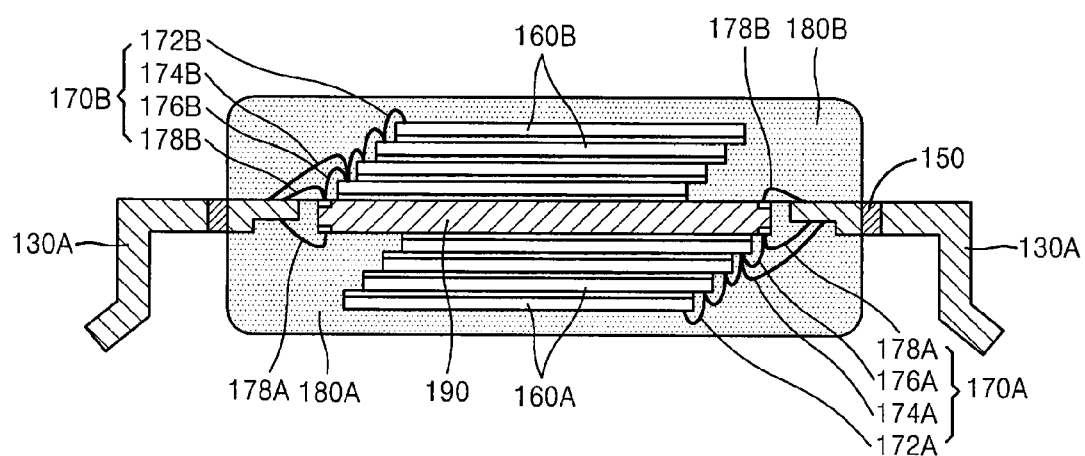

Referring to FIG. 7, a second molding process is performed on the leadframe 100 on which the second wire bonding process has been performed. By using the same method as illustrated in FIG. 4, the top surface of the interposer 190, top surfaces of the inner leads 110, the semiconductor chips 160B, and the wires 170B are encapsulated using an encapsulating material 180B.

After the second molding process is completed, a marking process for marking a type of the produced semiconductor package product on a surface of the encapsulating material 180B, and a trimming process for separating a plurality of outer leads 130A that are adhered to each other by the damber line 150 from one another and a forming process for bending each outer lead 130A are performed, thereby completing the manufacture of a stack-type high-capacity semiconductor package according to an exemplary embodiment of the present invention.

As described above, according to the one or more embodiments of the present invention, instead of using a general PCB as a base frame, a leadframe is used as a base frame, and thus, a semiconductor package with high reliability may be obtained. In addition, a plurality of semiconductor chips may be stacked using an interposer, and thus, a high-capacity memory semiconductor package may be easily manufactured. Moreover, the semiconductor package may be usefully used in IT equipment, such as a solid state disk (SSD).

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a stack-type high-capacity semiconductor package, the method comprising:
   preparing a leadframe not comprising a chip mount area and comprising only a lead on a tape;
   attaching an interposer on a center area of the leadframe;
   stacking a plurality of semiconductor chips stepwise on a first surface of the interposer;
   performing a first wire bonding process so as to connect the semiconductor chips, the lead, and the interposer;
   performing a first molding process so as to encapsulate a top surface of the leadframe, the semiconductor chips, and wires;
   detaching a tape from the leadframe and turning the leadframe on which the first molding process has been performed upside down;
   stacking a plurality of semiconductor chips on a second surface of the interposer;
   performing a second wire bonding process so as to connect the semiconductor chips, the lead, and the interposer; and
   performing a second molding process so as to encapsulate a bottom surface of the leadframe, the semiconductor chips, and wires.

2. The method of claim 1, wherein the tape is attached on the bottom surface of the leadframe.

3. The method of claim 1, wherein tips of inner leads of the leadframe are in a state that enables wire bonding to be performed on both surfaces of the leadframe.

4. The method of claim 1, wherein the interposer comprises one selected from a silicon wafer and a printed circuit board.

5. The method of claim 1, wherein the number of semiconductor chips stacked is 2 to 8.

6. The method of claim 1, wherein the semiconductor chips have polished bottom surfaces to decrease a thickness of the semiconductor chips.

7. The method of claim 1, wherein the first and second wire bonding processes comprise at least one selected from wire bonding that connects the semiconductor chips with each other, wire bonding that connects the semiconductor chip and the lead, wire bonding that connects the semiconductor chip and the interposer, and wire bonding that connects the interposer and the lead.

8. The method of claim 1, after detaching the tape from the leadframe, further comprising performing a cleaning process on the bottom surface of the leadframe.

9. The method of claim 1, after performing the second molding process, further comprising performing a marking process on a surface of a molded encapsulating material.

10. The method of claim 9, after performing the marking process, further comprising a trimming process for separating a plurality of outer leads of the leadframe from one another; and a forming process for bending each of the plurality of outer leads.

* * * * *